United States Patent [19]

Baues

[11] Patent Number: 4,525,873

[45] Date of Patent: Jun. 25, 1985

[54] DEVICE FOR TRANSMITTING MEASURED VALUES TO A REMOTE LOCATION

[75] Inventor: Peter Baues, Krailling, Fed. Rep. of Germany

[73] Assignee: Siemens Aktiengesellschaft, Berlin & Munich, Fed. Rep. of Germany

[21] Appl. No.: 409,155

[22] Filed: Aug. 18, 1982

[30] Foreign Application Priority Data

Sep. 24, 1981 [DE] Fed. Rep. of Germany ....... 3138073

[51] Int. Cl.$^3$ ............................................. H04B 19/00
[52] U.S. Cl. .................................... 455/600; 455/612; 370/3
[58] Field of Search ............... 455/605, 606, 607, 612; 370/3

[56] References Cited

U.S. PATENT DOCUMENTS

| 4,316,141 | 2/1982 | Adolfsson et al. | 455/617 |
| 4,326,298 | 4/1982 | Fromm et al. | 455/606 |
| 4,346,478 | 8/1982 | Sichling | 455/612 |

FOREIGN PATENT DOCUMENTS

| 56-36245 | 4/1981 | Japan | 455/612 |
| 56-36243 | 4/1981 | Japan | 455/612 |

OTHER PUBLICATIONS

Robertson, "Power Transfer Via Fiber Optics", *Proceedings of the 30th Electronics Components Conference, San Francisco, U.S.A., Apr. 28-30, 1980, pp. 216-221.*

Nelson et al., "Modulators for Multimode Single Fiber Communications Systems", *Proceedings of the Technical Program, Electro-Optical Systems Design Conference,* New York, N.Y., Sep. 14-16, 1976, pp. 36-39.

Auracher et al., "New Electro-Optic Bragg Deflectors With Low Insertion Loss and Multiple-Beam Capability", *Siemens Forsch. -u Entwickl.-Ber.*, vol. 10, (1981), No. 1, pp. 44-47.

Baues, "Integriert Optische Richtkoppler", *Elektronic-Anzeiger*, vol. 9 (1977), No. 3, pp. 19-22.

Somekh et al., "Channel optical waveguide directional couplers", *Applied Physics Letter*, vol. 22, No. 2, Jan. 1973, pp. 46-47.

Papuchon et al., "Electrically switched optical directional coupler: Cobra", *Applied Physics Letter*, vol. 27, No. 5, Sep. 1, 1975, pp. 289-291.

Schmidt et al., "Electro-optically switched coupler with stepped $\Delta\beta$-reversal using Ti-diffused LiNbO$_3$ waveguides", *Applied Physics Letter*, vol. 28, No. 1, May 1, 1976, pp. 503-506.

Kogelnick et al., "Switched directional couplers with alternating $\Delta\beta$", *IEEE Journal of Quantum Electronics*, vol. OE-12, No. 7, Jul. 1976, pp. 396-401.

Sasaki et al., "Electro-optic Y-junction modulator/-switch", *Electronics Letters*, vol. 12, No. 18, Sep. 2, 1976, pp. 459-460.

Keil et al., "Mach-Zehner Waveguide Modulators in Ti-diffused LiNbO$_3$", *Siemens Forsch. -u. Entwickl.-Ber.*, vol. 9, No. 1, 1980, pp. 26-31.

Kaminow, "Optical Waveguide Modulators", *IEEE Transactions on Microwave Theory and Technique*, vol. MIT-23, No. 1, Jan. 1975, pp. 57-70.

(List continued on next page.)

*Primary Examiner*—Robert L. Griffin
*Assistant Examiner*—Timothy K. Greer
*Attorney, Agent, or Firm*—Hill, Van Santen, Steadman & Simpson

[57] ABSTRACT

A device for transmitting measured values to a remote location characterized by the sensor device applying an output voltage control to an electro-optical modulator to create a light signal from a source of light received from an optical divider for conducting back to the remote location and the energy for the sensor device being supplied as light energy from a remote location to the optical divider whose other output beam is converted into electrical energy by a transducer associated with the sensor device.

28 Claims, 3 Drawing Figures

OTHER PUBLICATIONS

Brosio et al., "A Low Consumption, Light Powered Telephone on Optical Fibre", *Sixth European Conference on Optical Communication,* University of York, United Kingdom, Sep. 16–19, 1980, pp. 242–245.

Panish, "Heterostructure Injection Lasers", *IEEE Transaction on Microwave Theory and Techniques,* vol. MIT-23, No. 1, Jan. 1975, pp. 20–30.

Lebailly, "Situation des diodes électroluminescentes pour liaisons par fibres optiques", *Acta Electronica,* vol. 22 (1979), No. 4, pp. 301–310.

Heinlein et al., "Digitale Übertragung über optische Wellenleiter im Wallenlängenbereich Oberhalf 1 µm", *Frequenz,* vol. 32 (1978), No. 3, pp. 79–84.

Melchior, "Sensitive High Speed Photodetectors for the Demodulation of Visible and Near Infrared Light", *Journal of Luminescence,* vol. 7, (1973), pp. 390–414.

Ando et al., "Characteristics of Germanium Avalanche Photodiodes in the Wavelength Region of 1–1.6 µm", *IEEE Journal of Quantum Electronics,* vol. QE-14, 1978, No. 11, pp. 804–809.

DEVICE FOR TRANSMITTING MEASURED VALUES TO A REMOTE LOCATION

BACKGROUND OF THE INVENTION

The present invention is directed to a device having an arrangement for measuring or sensing a value of a measured condition at a test location and having an arrangement for transmitting the measure values to a remote location.

When transmitting a measured value, which is in the form of electrical signals, from the measured location to a remote location, various problems occur. Examples of these problems are that the electrical signals when transmitted, in particular, over electrical lines are sensitive to electro-magnetic radio interference and the employment of the electrical lines sometimes create problems because of safety reasons. For example the electrical signal can be influenced or distorted when transmitted through an area in which a high electrical potential difference occurs. In addition, the electrical signals being transmitted over the electrical line can create a danger of an explosion in certain areas. When a significant value is placed on a high operating safety, these above mentioned problems become of particular importance in industrial measurement techniques.

These above noted reasons speak in favor of attempting to modify the sensor technology by transmitting the measured values over optical lines particularly over light waveguides with the values being in the form of optical signals. Optical lines are insensitive to electromagnetic radio interference and they are particularly employable given a high electrical potential differences and in areas subject to the danger of explosion. Added thereto are the light weight, small dimensions and high flexiblity of the light waveguides as well as their resistance to most agressive chemical substances. The properties of light waveguides thus are considerably significant in the practical areas.

Another advantage of the use of light waveguides is that given the presently standard impressed 20 mA signal for the measured value transmission, high voltage levels, which have a negative effect on the power pack cost because of high power requirements, are required. In addition, after traveling in line lengths of approximatly 500 meters because of the significant line resistance, further processing of the signal will be required. In comparison thereto, light waveguides can bridge great distances because of the low attenuation from aporoximatly 1 dB/km through 5 dB/km.

However, problems do occur because many sensors or sensing means are active and therefore require an externally supplied electrical power for their operation. Beyond that, the amplitude as well as the chronological progression of the measured-value dependent electrical signal, for example the voltage is unsuitable for direct conversion into an optical signal in a number of sensors. Therefore, a pre-processing of the electrical signal emitted by the sensor is necessary and power must also be made available for this purpose.

SUMMARY OF THE INVENTION

An object of the present invention is to create a device which enables transmitting measured values to a remote location which device makes it possible in combination with an optical measured value transmission to transmit the required electrical power as light power and which device thereby retains the advantage of the optical signal transmission.

To accomplish these objects, the present invention is directed to an improvement in a device for transmitting measured values of a measured condition from a test location to a remote location, said device comprising sensor means for testing a condition to be measured and for creating electrical output signals dependent on the value of the condition and means for transmitting or communicating the output signal to a remote location. The improvements includes the means for communicating having modulator means being disposed adjacent the sensor means for receiving the electrical output signal and modulating light into a light signal in response to the electrical output signal, a first optical line for conducting or conveying light to the modulator means, a second optical line for conducting or conveying the modulated light signal from the modulator means to a point removed from the test location and means for supplying light energy to the first optical line and electrical energy to the sensor means which includes means for forming a light source positioned at a point remote from the test location, transducer means for converting optical power into an electrical power being arranged adjacant the sensor means, optical means for dividing an incoming beam of light into two output beams of light being positioned adjacent both the transducer means and the sensor means, one of the two output beams being directly coupled or connected to the first optical line, a third optical line extending from said means for forming a light source to the optical means to supply an incoming beam thereto, and a fourth optical line or waveguide extending between the optical means and said transducer means to supply the other of the two output beams to the transducer means.

Among other things, the device of the present invention can be utilized in industrial quality and process control. In addition, the device of the present invention has utility in military technology, for example in view of vehicles and missiles, and also in traffic engineering, for example in the control of motors.

In one embodiment of the invention, the means forming the light source is a single source of light which produces a beam of light of a single wavelength. The optical means is a beam splitter which splits the beam into two output beams. In another embodiment, the incoming light beam is a mixture of a first and second wavelength, which were from separate sources and mixed or combined into the beam by a wavelength multiplexer, and the optical means is a wavelength demultiplexer, which divides the mixture into two separate beams with one beam being the light of the first wavelength and the other beam being light of the second wavelength. In both embodiments, the two output beams of the optical device can have different power components with the beam that is coupled into the first optical line having a lower power component than the beam that is coupled into the fourth optical line. Preferably, the beam coupled into the first line is one-tenth as strong as the beam coupled into the fourth line. In the embodiment with a mixture of two wavelengths, this uneven power component is accomplished by using sources of different output strengths or power.

Preferably, the optical lines consist of at least one light waveguide. The third and fourth optical lines preferably comprises a plurality of light waveguides. Each of the waveguides is preferably a thick core fiber.

To obtain the desired amount of voltage for the sensor means, the transducer means may comprise either an opto-electrical transducer connected to a voltage transformer, a plurality of opto-electrical transducers connected in series or a plurality of opto-electrical transducers connected in series with their output to a voltage transformer. When utilizing a voltage transformer, an electrical storage device is preferably connected to the voltage transformer and the storage device may be a rechargeable storage device such as a battery or may be a capacitor. The means for supplying electrical power may also include controllable interrupt means, such as a bistable flip-flop, which is positioned adjacent the sensor means and coupled to the opto-electrical transducer to selectively interrupt or switch off the power to the sensor means in response to a control signal. With such an interrupt means, charging means are provided for charging the storage device during that period of time when the interrupt means has switched-off the power to the sensor means.

The sensor means includes at least one sensor element which will generate an electrical signal that is dependent on the sampled or tested value and the sensor means includes electronic means which converts the electrical signal of the sensor element into an electrical signal dependent thereon, which is suitable to drive the modulator means. If the output signal of the electronic means is an alternating voltage, its frequency is modulated by the electrical signal from the sensor element. If the output signal is a pulse sequence, then the signal from the sensor element will modulate the pulse phase and/or the pulse length of the signal. The signal from the sensor element can also be utilized to create an output signal from the electronic means which is a binary coded signal that represents the signal from the sensing element.

Preferably, the electronic means is formed as a low loss integrated complementary metal-oxide semiconductor device known as a CMOS or a current injected logic which is known as a $I^2L$ semiconductor circuit. In addition to the electronic means, the voltage transformer can also be formed of such low loss circuits.

The light source or the light sources that form the means for forming a light source may be opto-electronic transducers such as a laser or a light emitting diode and can also be a xenon arc lamp. These light sources can provide a steady output or a pulsed output which has a regular pulse sequence.

The second light waveguide may be conducted to an opto-electronic transducer such as a photodiode or an avalanche photodiode with a following amplifier.

The electro-optical modulator can consist of a monomode waveguide modulator or a multimode modulator. The multimode modulator may be a Bragg modulator.

DESCRIPTION OF THE PREFERRED EMBODIMENTS

Figure 1:
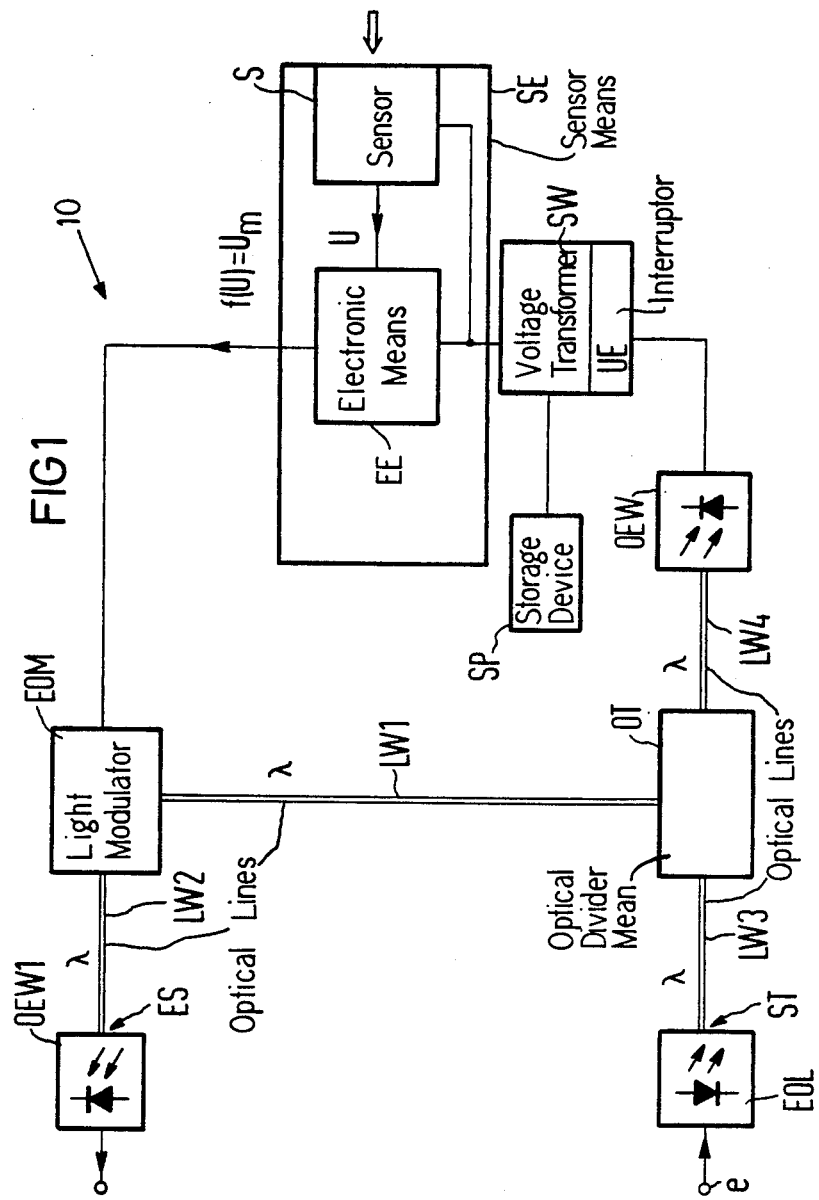
FIG. 1 is a block diagram of a device of the present invention.
Figure 2:
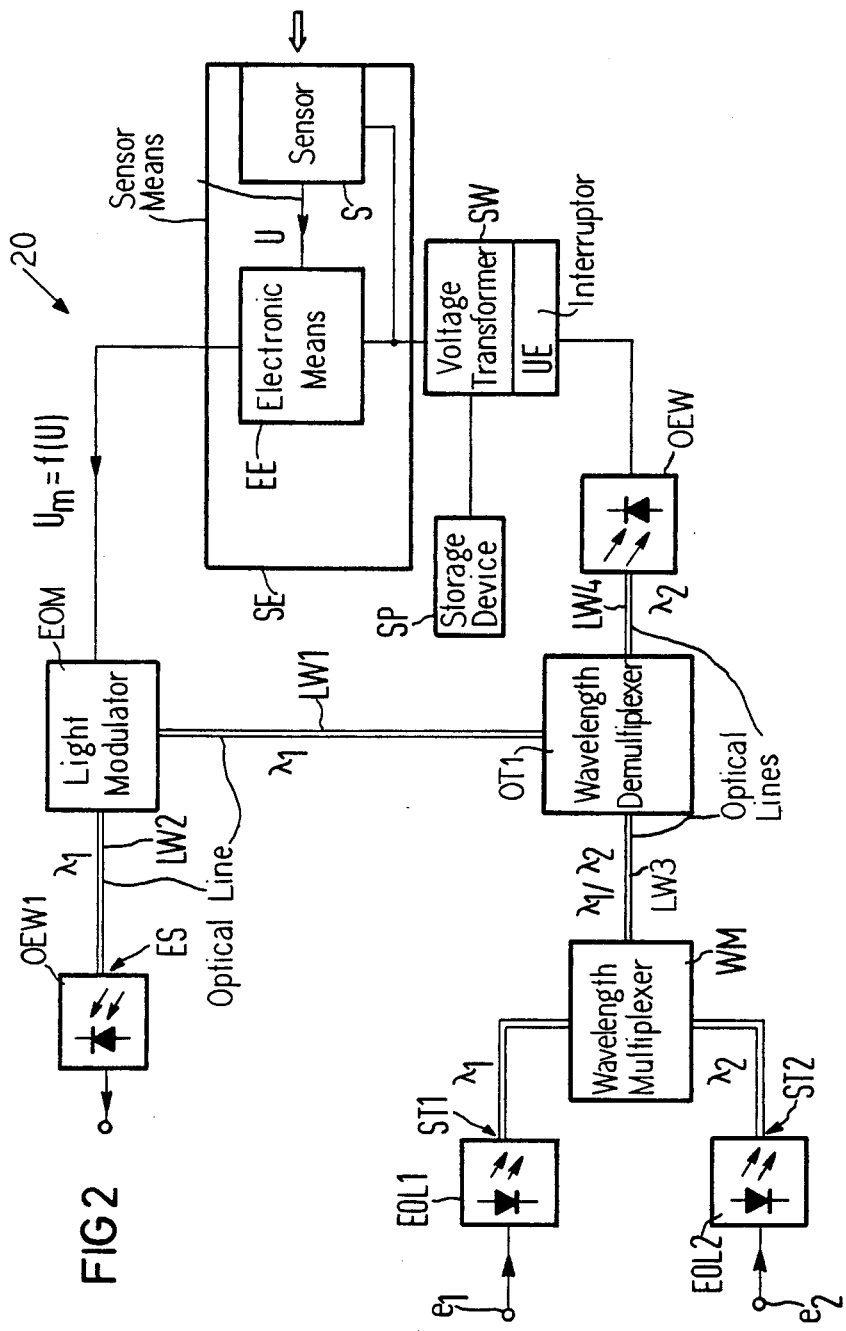
FIG. 2 is a block diagram of an embodiment of a device of the present invention.
Figure 3:
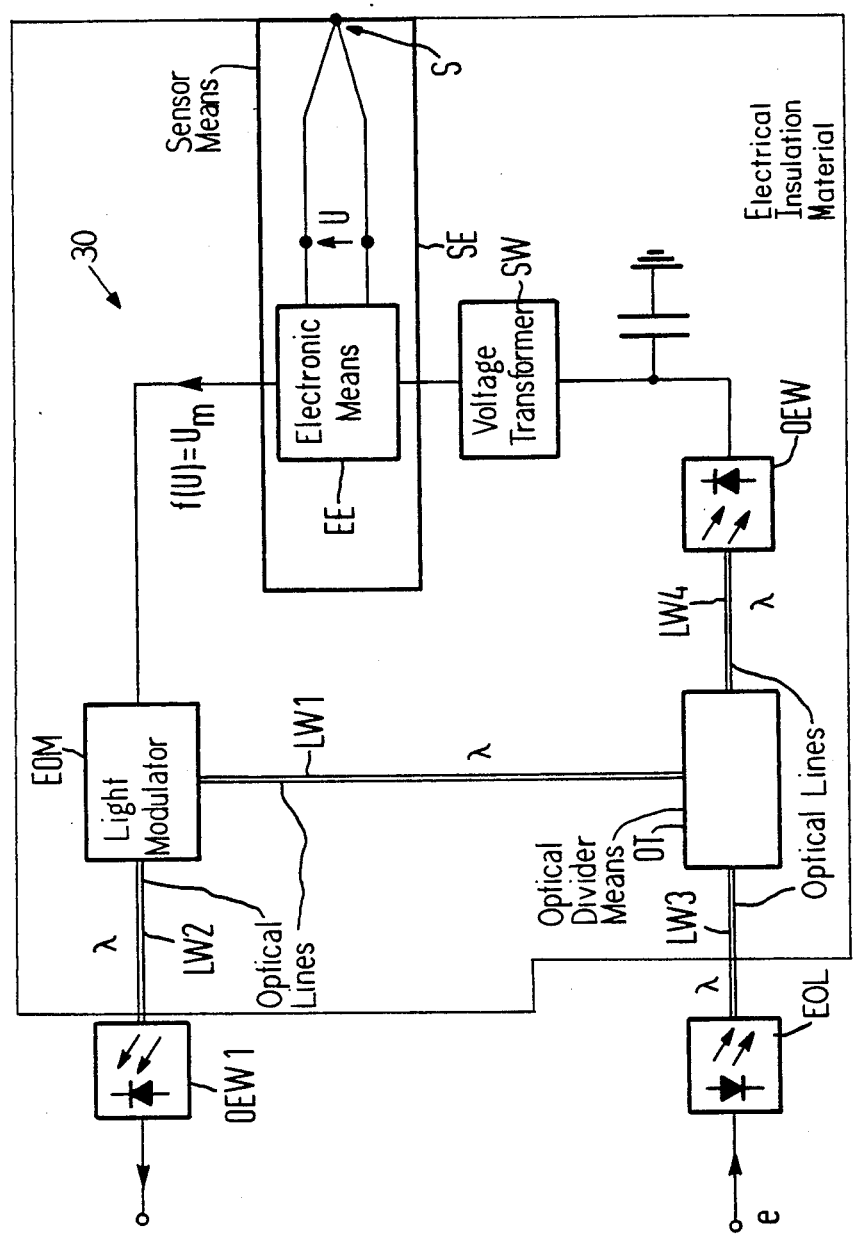
FIG. 3 is a block diagram of a modification of the device of FIG. 1.

The principles of the present invention are particularly useful in a device such as indicated at 10 in FIG. 1; as indicated at 20 in FIG. 2 or as indicated at 30 in FIG. 3.

Each of the devices 10, 20 and 30 of the present invention includes sensor means SE which is disposed at the test location and generate an electrical voltage $U_m$ which will depend on the sampled or tested values for the measured quantity or condition. This voltage $U_m$ is supplied as a control signal to modulator means or a light modulator EOM which is also disposed at the test location in a closed position or adjacent to the sensor means SE. Light is supplied to the light modulator EOM over a first optical line LW1. The light is modulated in the light modulator EOM by the voltage $U_m$ and is then conducted as a modulated light signal on a second optical line LW2 to an output location ES which is remote or removed from the test location and the light signal can be utilized at this location ES for purposes of further employment or processing.

To supply electrical energy to the sensor means SE and also to supply light to the waveguide LW1 which extends to the light modulator EOM, the device 10 of FIG. 1 includes means for supplying light energy to the first optical line LW1 and electrical energy to the sensor means SE. The means for supplying light energy includes an electro-optical transducer EOL which converts electrical energy into light energy of a wavelength $\lambda$ and is positioned at a remote location ST. The light of the waveguide $\lambda$ is coupled into a third optical line such as a light waveguide LW3 to be conveyed to optical means OT for dividing the light of the wavelength $\lambda$ into two output beams. In the embodiment of FIG. 1, the optical means OT, which is adjacent the sensor means SE, is a beam divider element which divides the light power of the specific wavelength $\lambda$ that is received from the light waveguide LW3 into separate light power components of a wavelength $\lambda$. One component is coupled into the first optical line LW1 and is thus supplied to the light modulator EOM. The other component or second output beam, also of the wavelength $\lambda$, is supplied over one or more light waveguides LW4 which form the fourth optical line that extends between the optical means OT and a transducer means OEW which is also positioned close to the sensing means SE. It should be noted, that an arrangement for power transmission over glass fibers is known per se and an example is disclosed in the article by M. M. Robertson, "Power Transfer Via Fiber Optics", *Proceedings of the 30th Electronic Components Conference,* San Francisco, Calif., U.S.A., Apr. 28–30, 1980, pages 216–221.

The splitting ratio of the beam splitting element which forms the optical means OT in the device 10 of FIG. 1 is preferably selected in such a manner that only a slight power component such as one-tenth of the supplied light power is coupled into the first light waveguide LW1. The larger power component for example nine-tenths of the supplied light power is coupled into the fourth optical line formed by the waveguides LW4.

In the embodiment of the invention illustrated by the device 20 of FIG. 2, the optical means OT1 consists of a wavelength demultiplexer which will divide the light powers of the mixture of wavelengths $\lambda_1$ and $\lambda_2$ that are received from the light waveguide LW3 into the two beams of light wavelengths $\lambda_1$ and $\lambda_2$. This dividing is according to the two wavelengths and the division of the light of a mixture of wavelengths into two separate beams of a given wavelength thus converts all the power components of the one wavelength $\lambda_1$ into the beam while all of the power components of the other wavelengths $\lambda_2$ is the second beam. The power component of the one wavelength $\lambda_1$ which for example again represents only one-tenth of the supplied overall power is coupled into the first light waveguide LW1 and is supplied to the electro-optical modulator EOM as the light beam to be modulated. The other larger power component for example amounts to nine-tenths of the overall power in the mixed beam is supplied through the fourth optical line to the transducer means formed by one or more photocells OEW.

In order to generate a mixed incoming beam having wavelengths $\lambda_1$ and $\lambda_2$, one expediently proceeds as illustrated in FIG. 2 with the means for providing a light source which is composed of a wavelength multiplexer WM, a first light source EOL1 in a position ST1 that produces a wavelength $\lambda_1$, a second light source EOL2 at a second position ST2 which produces light of a wavelength $\lambda_2$. These two separate sources are coupled by optical waveguides to the multiplexer so that the beam of the wavelength $\lambda_1$ and the beam of the wavelength $\lambda_2$ are combined or mixed into the mixed beam having the wavelengths of $\lambda_1$ and $\lambda_2$ and coupled into the third light waveguide LW3 to be conveyed to the multiplexer OT1 which is positioned close to the sensing means SE.

It should be noted, that in order to obtain the power components for both of the two wavelengths wherein the wavelenth $\lambda_2$ has approximately nine times the power component of the wavelength $\lambda_1$, the source EOL1 and EOL2 will have an output which is of the same approximate ratio.

In both the device 10 of FIG. 1 and the device 20 of FIG. 2, the operation of the transducer means OEW and its relationship with the other components of the sensor means SE are the same. Thus, the light received by the photocell or photocells of the transducer means OEW is converted into electrical energy which is then applied to the sensor means SE.

However, the voltage emitted by the photocell is too small for a direct operation of a power consuming component such as for example a semiconductor components. A voltage boost can be achieved by the following three arrangements. The light provided to the transformer means can be supplied to a plurality of photo electric cells which are connected in series to each other; or the light can be supplied to either a single photo electric element whose output is connected in a voltage transformer SW or a plurality of photo electric elements which are connected in series with their output being directed to the voltage transformer SW which may be a transverter or a commentator transformer and is preferably used in conjunction with a storage device SP for electrical energy.

The voltage transformer SW and the storage device SP can be assigned to the electrical part of the sensor means SE. Preferably, the sensor means SE also has a sensor S, which is composed of one or more elements, which generate a voltage U dependent on the sampled or measured values. The sensor means SE also contains an electronic means EE, which converts the voltage U generated by the sensor S into the voltage $U_m = f(U)$ that is dependent on the voltage U and which is suitable for the light modulator EOM. This voltage $U_m$ can be an alternating voltage whose frequency is controlled or modulated such as by a frequency modulation by the voltage U generated by the sensor S. Finally, it can also be a pulse sequence in which the pulse phase or the pulse length is modulated by the voltage U. However, the electronic means EE can also generate a binary coded signal which represents the voltage U from the senor S.

Preferably, a controllable interrupt means UE is coupled between the photocell and is disposed close to the sensor means SE. Thus, the power supply for the sensor means SE will be selectively interrupted or connected by the interrupt means UE by means of a control signal which can be supplied over the third optical line LW3. The interrupt means UE or interrupter can be formed by a bistable flip flop and under certain conditions it can be built directly into the voltage transformer SW.

Thus with the assistance of the corresponding interrupt means UE, the storage device SP can be charged with electrical energy. This will occur during a time span in which the power or current supply to the sensor means SE for the transducer OEW is interrupted. The storage device SP is preferably a rechargeable storage device and can be a storage battery for example a nickel cadium cell known as a NC cell or it can also be a capacitor.

The output voltage $U_m$ from an electronic means EE is supplied to the light modulator EOM which controls the light passage in accordance with the voltage $U_m$. If viewed electrically, the light modulator acts as a small capacitor and can be a known multi-mode modulator, a Bragg modulator or a mono-mode waveguide modulator. An example of a multi-mode modulator is disclosed by an article by A. R. Nelsen et al, "Modulators for Multimode Single Fiber Communications Systems", *Proceedings of the Technical Program, Electro-Optical Systems Design Conference,* New York, Sept. 14–16, 1976, pages 36–39. An example of a Bragg modulator is disclosed in an article by F. Auracher et al, "New Electro-Optic Bragg Deflectors With Low Insertion Loss and Multiple-Beam Capability", *Siemens Forsch. -u Entwickl.-Ber.,* Vol. 10, (1981) No. 1, pages 44–47. Monomode light waveguide modulators are classified into three different groups. The first group is directional coupler modulators which are discussed by P. Baues, "Integriert optische Richtkoppler", *Elektronik-Anzeiger,* Vol. 9 (1977), No. 3, pages 19–22. The first group has two sub-groups with one sub-group being directional modulators with electrodes that are continuous for the full coupling length which are disclosed by S. Somekh et al, "Channel optical waveguide directional couplers", *Applied Physics Letter,* Vol. 22 (1973), pages 46–47 and by M. Papuchon et al, "Electrically switched optical directional coupler: Cobra", *Applied Physics Letter,* Vol. 27 (1975), pages 289–291. The other sub-group is directional coupler modulators with divided or split electrodes on the coupling length which are disclosed by R. V. Schmidt et al, "Electro-optically switched coupler with stepped $\Delta\beta$-reversal using Ti-diffused LiNbO$_3$ waveguides", *Applied Physics Letter,* Vol. 28 (1976), pages 503–506 and by H. Kogelnik et al, "Switched directional couplers with alternating $\Delta\beta$", *IEEE Journal of Quantum Electronics,* Vol. OE-12, No. 7, July 1976, pages 396–401. The second group of mono-mode modulators are controllable y-junction modulators which are disclosed by H. Sasaki et al, "Electro-optic Y-junction modulator/switch", *Electronics Letters,* Vol 12, September 1976, pages 459–460. The third group of mono-mode modulators is Mach-Zehner modulators which have a sub-group with Y-junction which are disclosed by R. Keil et al, "Mach-Zehner Waveguide modulators in Ti-diffused LiNbO$_3$", *Siemens Forsch. -u. Entwickl-Ber.,* Vol. 9, No. 1, 1980, pages 26–31 and a second sub-group with 3-dB couplers which are disclosed by J. P. Kaminow, "Optical Waveguide Modulators", *IEEE Transactions on Microwave Theory and Technique,* Vol. MTT-23, No. 1, January 1975, pages 57–70.

For obtaining one of the above described modulation methods, the electronic means EE or electronic part of the sensor means SE preferably consists of a low-loss, integrated complementary method-oxide-semiconductor device, which is called a CMOS device or a current injected logic semiconductor circuit which is called I$^2$L semiconductor circuit. These circuits are known in semiconductor technology and can be constructed without difficulties. Voltage transformers are mentioned in the above mentioned article by M. M. Robinson and also by A. Brosio et al, "A Low Consumption, Light Powered Telephone on Optical Fibre", *Sixth European Conference on Optical Communication,* York, United Kingdom, Sept. 16–19, 1980, pages 242–245.

The optical line formed by the light waveguide LW3 which extends to a remote location or source in device 10 is preferably connected to a source of light such as an electro-optical power conversion unit EOL that couples light into the waveguide. The unit EOL receives an electrical input e and converts this electrical power into light power. In a similar manner, the sources of the device 20 are formed by units EOL1 and EOL2 which is also an electro-optical power conversion units that receives electrical energy $e_1$ and $e_2$ respectively. All of these light sources can produce a steady radiation or pulse radiation which is modulated in the form of regular pulse sequences. When the light is modulated in pulse sequences, the line length between the test location where the sensor means SE is located and the two locations such as ST or ST1 and ST2 for example, which may be in the central station, can be increased as a result of a high pulse power peak which are now possible. Another advantage is that for the semiconductor technology the voltage transformer receives an alternating current emitted by the photocell which current was created from the pulse sequences.

The units or means EOL, EOL1 and EOL2 for the electro-optical power conversion can be light transmitters of various types. All types of lasers including semiconductor lasers or solid state lasers, gas lasers can be utilized. Light emitting diodes can also be used. Various materials are employed for the manufacture of the semiconductor lasers and for light emitting diodes which materials depend on the light wavelength desired. Examples of materials used for semiconductor lasers are disclosed by M. B. Panish, "Heterostructure Injection Lasers", *IEEE Transaction on Microwave Theory and Techniques,* Vol. MTT-23, pages 20–30. Examples of light emitting diode materials are disclosed by J. Lebailly, "Situation des diodes électroluminescentes pour liaisons par fibres optiques", *Acta Electronica,* Vol. 22 (1979), No. 4, pages 301–310. The semiconductors may be ternary semiconductors such as (GaAl)As or (InGa)As or may be quarternary semiconductors such as (GaIn)(AsP) which are disclosed by W. Heinlein et al, "Digitale Übertragung über optische Wellenleiter im Wellenlängenbereich Oberhalb 1 /μm", *Frequenz,* Vol. 32, (1978), No. 3, pages 79–84. Binary semiconductors such as GaP also come into consideration for light emitting diodes. The gas lasers can be He-Ne lasers. For the unit EOL2 which serves for power transmission or transfer, a xenon arc lamp can also be utilized as the light source.

A photodiode or avalanche photodiode OEW1 with a preferably following amplification is expediently provided at the output location ES which for example can lie at the central station. The photodiode or avalanche photodiode reconverts the modulator light signal conducted to the output location ES into electrical signals. Photodiodes usually consist of silicon as disclosed by H. Melchior, "Sensitive High Speed Photodetectors for the Demodulation of Visible and Near Infrared Light", *J. Luminescence,* Vol. 7 (1973), pages 390–414, but germanium photo diodes also come into consideration for longer wavelengths of the light as disclosed in H. Ando et al, "Characteristics of Germanium Avalanche Photodiodes in the Wavelength Region of 1–1.6 μm", *IEEE Journal of Quantum Electronics,* Vol. QE-14, 1978, No. 1, pages 804–809. As in the case of laser diodes and light-emitting diodes, the photo diodes can also be manufactured of ternary or quarternary semiconductors.

The photocell is a special photodiode for the conversion of optical energy into electrical energy. Depending upon the wavelength of the light being received, it is manufactured of the same materials as the photodiode.

The light waveguides can be optical fibers having a stepped index of refraction, they can be optical fibers with a gradient index of refraction or they can be monomode waveguides. Preferably, thick core fibers with a particularly large core cross section come into consideration.

The power or current supply for the sensor element is optional. There are sensor elements, which obtain enough power from the measured condition or quantity that a voltage is produced which is sufficient for driving the electronic means EE. Such sensors, for example are piezoelectric transducers, thermo elements, Hall-effect transducers, etc. However, other sensor elements require a power supply for generating the voltage U. These types of sensors include, for example, foil strain gauges, for example in the form of bridge circuits, captive pressure pick-ups, etc.

In FIG. 3, a modification of the device 10 is illustrated as the device 30. In the device 30, the sensor element S is a thermo-element which provides voltage U to the electronic means EE. The sensor S does not require any external power and the transducer SW is connected directly to the electronic means EE. In this modification the storage device is a capacitor.

The power consuming sensor means SE and if need, the electronic means EE and the parts, which are electrically coupled thereto for example the electro-optical transducer OEW, the voltage transformer SW, the interrupt means UE, if present, the storage means SP for electrical energy, if present, and the electro-optical modulator EOM, are expediently combined to form a structural unit. It is particularly expedient to completely embed or encapsulate this group of parts in an electrically insulating material, for example PVC, in such a manner that only the sensor elements sampling the measured quantity remains accessible from the outside of the structural unit or means. This construction is recommendable for employment in areas in which danger of explosion and/or high electrical potential differences prevail. A very high safety factor can therefore be achieved in a relatively cheap manner.

In general, the proposed arrangement device is excellently suited for potential separation.

The storage unit SP chargeable by means of the optically supplied energy enables very large distances to be bridged.

The term such as "remote" and "close" or adjacent as used hereinabove are quantitatively understood. A location remote from the sensor means SE is farther removed therefrom than a location situated close to the sensor means or adjacent to the sensor means. In practice, a remote location or location far removed from the sensor means SE will frequently be at a distance from the sensor means in the range of 1 meter or more whereas a part lying close to or adjacent the sensor means will be a distance from the sensor element in a range of 1 cm and below and even closer in the case of an integrated circuit.

Although various minor modifications may be suggested by those versed in the art, it should be understood that I wish to embody within the scope of the patent granted hereon, all such modifications as reasonably and properly come within the scope of my contribution to the art.

I claim:

1. In a device for transmitting measured values of a measured condition from a test location to a remote location, said device comprising sensor means for testing a condition to be measured and creating an electrical output signal dependent on the value of the condition, said sensor means requiring electrical energy for operation and having electrical parts and at least one sensor element for creating an electrical signal which is dependent on the measured values, and means for communicating the electrical output signal to a remote location, the improvements comprising the means for communicating including a modulator means being disposed adjacent the sensor means for receiving the electrical output signal of the sensor means and modulating light into a light signal in response to the electrical output signal, a first optical line for conveying light to the modulator means, a second optical line for conveying the light signal from the modulator means back to a location remote from the sensor means; said sensor means including electronic means for converting the electrical signal of the sensor element into an electrical output signal for operating the modulator means by creating an output voltage of an alternating voltage whose frequency is modulated by the electrical signal of the sensor element; said device including means for supplying light energy to the first optical line and electrical energy to the sensor means including means for forming a light source at a position remote to the sensor means, a voltage transformer, an electrical rechargeable storage device being connected to the voltage transformer, transducer means being disposed adjacent the sensor means for converting light into electrical energy for operation of the electrical parts of the sensor means, said transducer means being connected to the sensor means by the voltage transformer, optical means for dividing an incoming beam of light into two output beams of light being positioned adjacent the transducer means and sensor means, one of the two output beams being connected to the first optical line, a third optical line extending from said means for forming a light source to the optical means, and a fourth optical line extending from said optical means to the transducer means to supply the other of the two output beams to the transducer means; and said device including structural means to encapsulate the modulator means, the voltage transformer, the storage device, the transducer means and the sensor means in an electrical insulation material with only the sensor element being accessible from the exterior of the structural means.

2. In a device according to claim 1, wherein said means for forming a light source provides light of a specific wavelength in the third optical line, said optical means being a beam splitter element splitting the light of a specific wavelength into said two output beams.

3. In a device according to claim 1, wherein said means for forming a light source provides a mixture of light of a first and second wavelengths, said optical means being a wavelength demultiplexer for dividing the mixture of light into two output beams of separate wavelengths, so that one output beam has a first wavelength and the other output beam has the second wavelength.

4. In a device according to claim 3, wherein said means for forming a light source includes a first source providing said first wavelength, a second source providing the second wavelength and a wavelength multiplex for coupling the first and second wavelengths into the third optical line.

5. In a device according to claim 4, wherein the output power of one of the first and second sources is less than the output power of the other source of the first and second sources.

6. In a device according to claim 1, wherein said optical means divides the incoming beam into two output beams of different power components with the one output beam connected to the first optical line being smaller than the other output beam.

7. In a device according to claim 6, wherein the power component of the one output beam is approximately one-tenth of the power component of the other output beam.

8. In a device according to claim 1, wherein each of the optical lines consist of at least one light waveguide.

9. In a device according to claim 8, wherein each of the third and fourth optical lines comprises a plurality of light waveguides.

10. In a device according to claim 8, wherein each of the light waveguides of the optical lines comprises a thick core fiber.

11. In a device according to claim 1, wherein the transducer means includes a plurality of opto-electrical transducers connected in series for receiving the light from optical means.

12. In a device according to claim 1, wherein the rechargeable storage device consists of a storage battery.

13. In a device according to claim 1, wherein the rechargeable storage device is a capacitor.

14. In a device according to claim 1, wherein the electrical output signal of the electronic means is a pulse sequence having pulse phase and length modulated by the electrical signal from the sensor element.

15. In a device according to claim 1, wherein the electronic means produces a binary coded signal for application to the modulator means, said code representing the electrical signal from the sensor element.

16. In a device according to claim 1, wherein the electronic means comprises a low-loss integrated CMOS.

17. In a device according to claim 1, wherein the electronic means comprises a low-loss current injected logic semiconductor circuit.

18. In a device according to claim 1, which includes controllable interrupt means being disposed adjacent the sensor means in the stucture means and coupled to the transducer means, said interrupt means selectively interrupting the power supply being applied to the sensor means in response to the control signals supplied on the fourth optical line.

19. In a device according to claim 18, wherein the interrupt means includes a bistable flip flop.

20. In a device according to claim 18, wherein said storage device is charged during a time span in which the interrupt means has discontinued application of the electrical power to the sensor means.

21. In a device according to claim 1, wherein the means for forming a light source includes at least one electro-optical power transducer having an optical power output being coupled into the third optical line and which device includes an opto-electronic transducer being provided at the remote location and connected to the output of the second optical transmission line so that the optical signal is converted into an electrical signal for further processing.

22. In a device according to claim 21, wherein each electro-optical power transducer is selected from a group consisting of lasers, light emitting diodes and xenon arc lamps.

23. In a device according to claim 21, wherein at least one of the electro-optical power transducers emits steady radiation.

24. In a device according to claim 21, wherein at least one of the electro-optical transducers emits a pulsed radiation with a regular pulse sequence.

25. In a device according to claim 21, wherein the opto-electronic transducer connected to the second optical line is selected from a group consisting of photodiodes and avalanche photodiodes with a following amplifier.

26. In a device according to claim 1, wherein the modulator means consists of a monomode light waveguide modulator.

27. In a device according to claim 1, wherein the modulator means consists of a multimode modulator.

28. In a device according to claim 27, wherein the multimode modulator is a Bragg modulator.

* * * * *